(12) United States Patent
Kim

(10) Patent No.: US 8,258,538 B2
(45) Date of Patent: Sep. 4, 2012

(54) LIGHT EMITTING DEVICE PACKAGE

(75) Inventor: Ki Bum Kim, Osan-si (KR)

(73) Assignee: LG Innotek Co., Ltd., Seoul (KR)

( * ) Notice: Subject to any disclaimer, the term of this patent is extended or adjusted under 35 U.S.C. 154(b) by 203 days.

(21) Appl. No.: 12/702,395

(22) Filed: Feb. 9, 2010

(65) Prior Publication Data

US 2010/0230700 A1 Sep. 16, 2010

(30) Foreign Application Priority Data

Mar. 10, 2009 (KR) .................. 10-2009-0020064

(51) Int. Cl.
*H01L 33/00* (2010.01)

(52) U.S. Cl. ............ 257/99; 438/29; 438/106; 438/107; 438/122; 438/123; 257/98; 257/676; 257/E33.066; 257/E33.061

(58) Field of Classification Search ............ 257/99
See application file for complete search history.

(56) References Cited

U.S. PATENT DOCUMENTS

| | | | | |
|---|---|---|---|---|
| 3,942,245 | A * | 3/1976 | Jackson et al. ............ | 29/827 |
| 5,859,471 | A * | 1/1999 | Kuraishi et al. ........... | 257/666 |
| 6,087,715 | A | 7/2000 | Sawada et al. ............ | 257/666 |
| 6,610,563 | B1 | 8/2003 | Waitl et al. ............... | 438/166 |
| 6,936,855 | B1 * | 8/2005 | Harrah ...................... | 257/88 |
| 7,258,816 | B2 | 8/2007 | Tamaki et al. ............ | 252/301.4 |
| 7,514,293 | B2 * | 4/2009 | Amano et al. ............ | 438/112 |
| 7,554,129 | B2 | 6/2009 | Roth et al. ................ | 257/103 |
| 7,709,952 | B2 * | 5/2010 | Park et al. ................ | 257/717 |
| 7,795,626 | B2 * | 9/2010 | Chen et al. ................ | 257/88 |
| 7,812,360 | B2 * | 10/2010 | Yano ......................... | 257/98 |
| 7,815,343 | B2 | 10/2010 | Nii et al. ................... | 362/311.03 |
| 7,928,457 | B2 | 4/2011 | Kato et al. ................. | 257/98 |
| 2002/0075634 | A1 * | 6/2002 | Uenishi et al. ............ | 361/523 |
| 2004/0108595 | A1 * | 6/2004 | Shen ......................... | 257/737 |
| 2005/0224918 | A1 * | 10/2005 | Kobayashi et al. ....... | 257/600 |
| 2005/0258524 | A1 * | 11/2005 | Miyaki et al. ............. | 257/676 |
| 2007/0096133 | A1 * | 5/2007 | Lee et al. .................. | 257/99 |
| 2007/0176194 | A1 * | 8/2007 | Wakamatsu et al. ...... | 257/98 |
| 2007/0246731 | A1 | 10/2007 | Isokawa et al. ........... | 257/99 |
| 2007/0262328 | A1 * | 11/2007 | Bando ....................... | 257/79 |

(Continued)

FOREIGN PATENT DOCUMENTS

DE 20 2007 012 162 U1 3/2008

(Continued)

OTHER PUBLICATIONS

Korean Office Action dated Nov. 11, 2010 issued in Application No. 10-2009-0020064.

(Continued)

*Primary Examiner* — N Drew Richards
*Assistant Examiner* — Ankush Singal
(74) *Attorney, Agent, or Firm* — KED & Associates, LLP

(57) ABSTRACT

A light emitting device package is provided. The light emitting device package may include a package body having a cavity formed therein, a lead frame, and a light emitting device positioned in the cavity and electrically connected to the lead frame. The lead frame may penetrate the package body such that one end of the lead frame is positioned in the cavity and the other end of the lead frame is exposed to an outside of the package body. The lead frame may be partially coated with a thin metal layer.

16 Claims, 4 Drawing Sheets

U.S. PATENT DOCUMENTS

| | | | |
|---|---|---|---|
| 2008/0089011 A1* | 4/2008 | Tasei et al. | 361/502 |
| 2008/0210965 A1 | 9/2008 | Hung | 257/98 |
| 2008/0293190 A1 | 11/2008 | Inao et al. | 438/123 |
| 2008/0296592 A1 | 12/2008 | Osamu | 257/89 |
| 2008/0303157 A1* | 12/2008 | Cheng et al. | 257/758 |
| 2009/0026480 A1* | 1/2009 | Hayashi et al. | 257/98 |
| 2009/0057850 A1 | 3/2009 | Moy et al. | 257/666 |
| 2009/0096041 A1* | 4/2009 | Sakakibara et al. | 257/419 |
| 2009/0176335 A1* | 7/2009 | Amano et al. | 438/123 |
| 2009/0289274 A1 | 11/2009 | Park | 257/99 |
| 2010/0163918 A1 | 7/2010 | Kim et al. | 257/99 |
| 2010/0289051 A1* | 11/2010 | Lee et al. | 257/98 |

FOREIGN PATENT DOCUMENTS

| | | |
|---|---|---|
| EP | 1 998 380 A2 | 12/2008 |
| JP | 2004-172160 A | 6/2004 |
| KR | 10-2002-0079449 | 10/2002 |
| KR | 10-2005-0003226 | 1/2005 |
| KR | 10-2006-0030356 | 4/2006 |
| KR | 10-2007-0006747 | 1/2007 |
| KR | 10-2008-0017522 | 2/2008 |
| WO | WO 2007/108667 A1 | 9/2007 |
| WO | WO 2008/038997 A1 | 4/2008 |

OTHER PUBLICATIONS

European Search Report dated Oct. 6, 2010 issued in Application No. 10 15 5808.

European Search Report dated Oct. 6, 2010 issued in Application No. 10 15 6030.

European Search Report dated Apr. 21, 2011 issued in Application No. 10 15 6030.

DIODES Incorporated, "Recommended Soldering Techniques"; www.diodes.com; pp. 1-7.

U.S. Office Action dated Nov. 28, 2011 issued in U.S. Appl. No. 12/720,235.

U.S. Office Action issued in U.S. Appl. No. 12/720,235 dated Mar. 28, 2012.

Tin Plating [on line], [retrieved Mar. 15, 2012]. Retrieved from the internet <URL: http://en.wikipedia.org/wiki/Plating#Tin_plating>.

He Shu-guang; Li Li; Qi Er-shi;, "Study on the Quality Improvement of Injection Molding in LED Packaging Processes Based on DOE and Data Mining," Wireless Communications, Networking and Mobile Computing, 2007. WiCom 2007. International doi: 10.1109/WICOM2007.1626.

Lin, Tony, and Belli Chananda. "Quality Improvement of an InjectionMolded Product Using Design of Experiments: A Case Study." Quality Engineering 16.1 (2003): 99-104.

* cited by examiner

LIGHT EMITTING DEVICE PACKAGE

CROSS-REFERENCE TO RELATED APPLICATIONS

This claims priority under 35 U.S.C. §119(e) to Korean Patent Application No. 10-2009-0020064 (filed in Korea on Mar. 10, 2009), the entirety of which is incorporated herein by reference.

BACKGROUND

1. Field

This relates to a light emitting device package.

2. Background

Group III-V nitride semiconductors may be used as core materials of light emitting devices such as light emitting diodes (LEDs) or laser diodes (LDs) owing to their physical and chemical characteristics. Generally, group III-V nitride semiconductors may be formed of semiconductor materials having a composition formula of $In_xAl_yGa_{1-x-y}N$ ($0 \leq x \leq 1$, $0 \leq y \leq 1$, $0 \leq x+y \leq 1$).

LEDs are, semiconductor devices capable of converting electricity into infrared rays or light using the characteristics of compound semiconductors so as to transmit and receive signals, or so as to be used as light sources. Such LEDs or LDs formed of nitride semiconductor materials may be used as light emitting devices for generating light, for example, as a light source of a light emitting part of a mobile phone keypad, an electronic display board, or other lighting device.

BRIEF DESCRIPTION OF THE DRAWINGS

The embodiments will be described in detail with reference to the following drawings in which like reference numerals refer to like elements wherein.

DETAILED DESCRIPTION

Reference will now be made in detail to various embodiments, examples of which are illustrated in the accompanying drawings.

Figure 1:
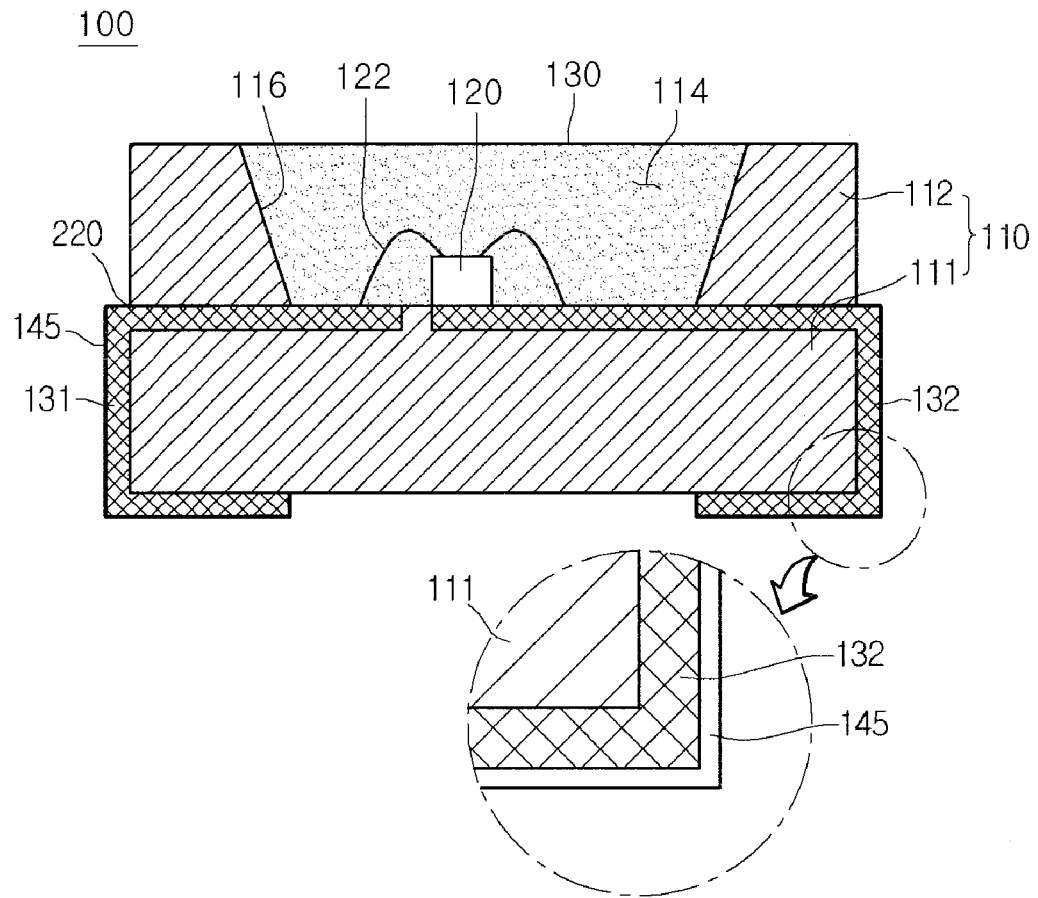
FIG. 1 is a sectional view of a light emitting device package according to an embodiment as broadly described herein.

A light emitting device package 100 as shown in FIG. 1 may include a package body 110 in which a cavity 114 is formed, first and second lead frames 131 and 132, a light emitting device 120, and a sealing material 130.

The package body 110 may be formed of, for example, a PCB, a ceramic substrate, and a resin material. In the embodiment shown in FIG. 1, the package body 110 may be formed of a polyphthalamide (PPA) resin. The package body 110 may include a lower body 111 and an upper body 112. The lower and upper bodies 111 and 112 may be injection-molded as a single piece with the first and second lead frames 131 and 132. Alternatively, the upper body 112 may be deposited on the lower body 111 and the first and second lead frames 131 and 132. In the embodiment shown in FIG. 1, the lower and upper bodies 111 and 112 of the package body 110 may be formed as a single piece but are designated with different reference numerals for clarity of illustration.

The first and second lead frames 131 and 132 may penetrate the package body 110. The embodiment shown in FIG. 1 includes first and second lead frames 131 and 132; however, three or more lead frames may be included based on the design of the light emitting device package 100.

First ends of the first and second lead frames 131 and 132 may penetrate the package body 110 and be exposed to the cavity 114, and second ends of the first and second lead frames 131 and 132 may be exposed to the outside of the package body 110. The first and second lead frames 131 and 132 are electrically separated and are configured to supply power to the light emitting device 120.

In certain embodiments, when viewed from the top side, the cavity 114 may have a circular or polygonal shape, and a circumferential surface 116 of the cavity 114 may be perpendicular to or sloped from the top side of the lower body 111. Other arrangements may also be appropriate.

The light emitting device 120 may be positioned on the second lead frame 132. The light emitting device 120 may be electrically connected to the first and second lead frames 131 and 132 by, for example, wires 122.

The light emitting device 120 may be electrically connected to the first and second lead frames 131 and 132 by various methods. For example, the light emitting device 120 may be electrically connected to the first and second lead frames 131 and 132 by a flip bonding method. Alternatively, the light emitting device 120 may be electrically connected to the second lead frame 132 by a die bonding method and then be electrically connected to the first lead frame 131 by a wire. Other methods may also be appropriate.

In addition, the light emitting device 120 may be positioned on the package body 110, or on a lead frame other than the first and second lead frames 131 and 132.

The light emitting device 120 may be a light emitting diode chip configured to emit red, green, and blue light. Alternatively, the light emitting device 120 may be a light emitting diode chip configured to emit ultraviolet (UV) light.

The sealing material 130 provided in the cavity 114 may be formed of a transparent resin such as, for example, a silicon resin, an epoxy resin, or other material as appropriate and a fluorescent material may be dispersed through all or part of the transparent resin.

Each of the first and second lead frames 131 and 132 may branch off into two or more parts and penetrate at least two parts of the package body 110.

The first and second lead frames 131 and 132 may be bent around the package body 110 through, for example trimming and forming processes. In the embodiment shown in FIG. 1, the first and second lead frames 131 and 132 contact the lateral sides and bottom side of the lower body 111 by bending.

In certain embodiments, the first and second lead frames 131 and 132 may be formed of a metal or alloy including copper (Cu) as a main component, and may be coated with at least one of a nickel plating layer, a gold plating layer, or a silver plating layer. In this embodiment, the first and second lead frames 131 and 132 are coated with a silver plating layer.

A thin metal layer 145 may be partially disposed on the first and second lead frames 131 and 132. For example, the thin metal layer 145 may be formed by a plating process using a material including tin (Sn).

The thin metal layer 145 may be provided on parts of the first and second lead frames 131 and 132 which are exposed to the outside of the package body 110. The thin metal layer 145 may also be provided on parts of the first and second lead frames 131 and 132 which are exposed through gaps 220 between the first and second lead frames 131 and 132 and the package body 110.

After the trimming and forming processes, there may be some separation between the first and second lead frames 131 and 132 and the package body 110, resulting in gaps 220 between the first and second lead frames 131 and 132 and the package body 110.

Since the thin metal layer 145 is formed after trimming and forming of the first and second lead frames 131 and 132, the thin metal layer 145 may be disposed on parts of the first and second lead frames 131 and 132 that form the gaps 220. However, the thin metal layer 145 is not disposed on the contact surface between the first and second lead frames 131 and 132 and the package body 110.

The light emitting device package 100 may be positioned on a substrate by using surface mount technology (SMT), and thus the light emitting device package 100 may be easily mounted because the thin metal layer 145 may increase thermal efficiency. In addition, the thin metal layer 145 may prevent oxidation of the first and second lead frames 131 and 132 and improve the electrical characteristics of the first and second lead frames 131 and 132. Furthermore, since the thin metal layer 145 is filled in the gaps 220, permeation of air, humidity, or foreign substances through the gaps 220 may be prevented.

Manufacturing of a light emitting device package as embodied and broadly described herein will now be discussed with respect to FIGS. 2-5.

Figure 2:
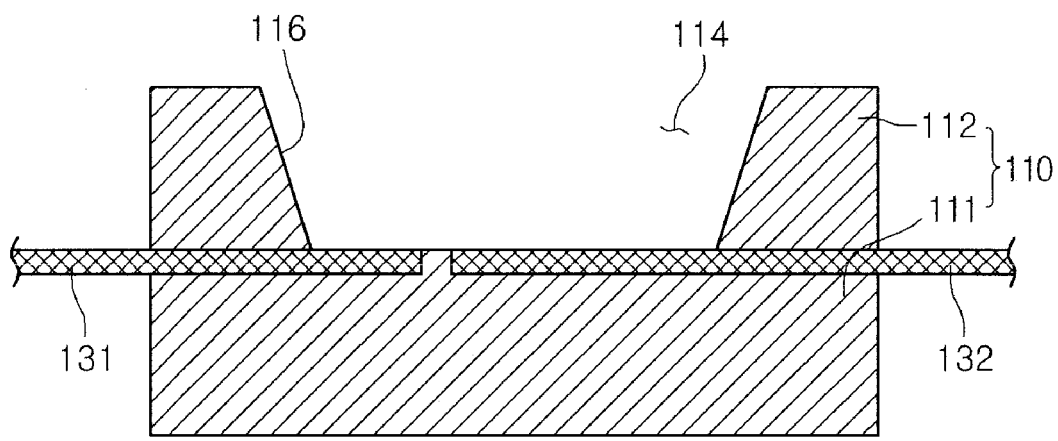
FIGS. 2 to 5 illustrate processes of manufacturing a light emitting device package as shown in FIG. 1.

Referring to FIG. 2, first and second lead frames 131 and 132 are positioned in a molding apparatus, and a resin is injected so as to form the first and second lead frames 131 and 132 and the package body 110 as a single piece by molding.

The first and second lead frames 131 and 132 may be formed of a metal or alloy including copper (Cu) as a main component, and may be coated with at least one of a nickel plating layer, a gold plating layer, or a silver plating layer, prior to being inserted into the molding apparatus. In this embodiment, the first and second lead frames 131 and 132 are coated with a silver plating layer.

Figure 3:
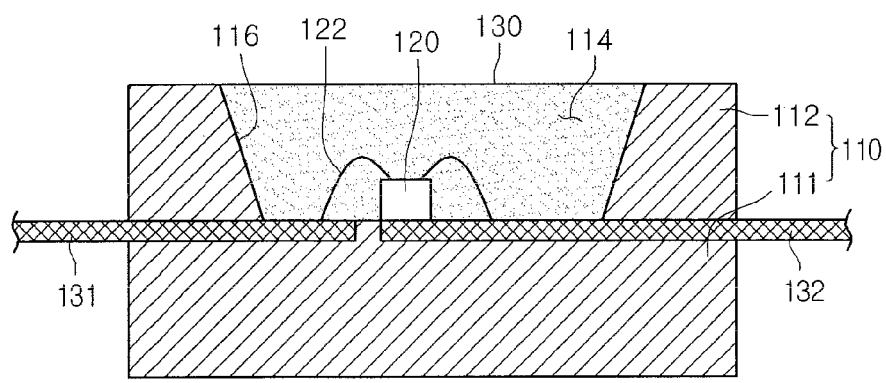

Referring to FIG. 3, a light emitting device 120 is positioned on the second lead frame 132 and is electrically connected to the first and second lead frames 131 and 132 by wires 122.

Figure 4:
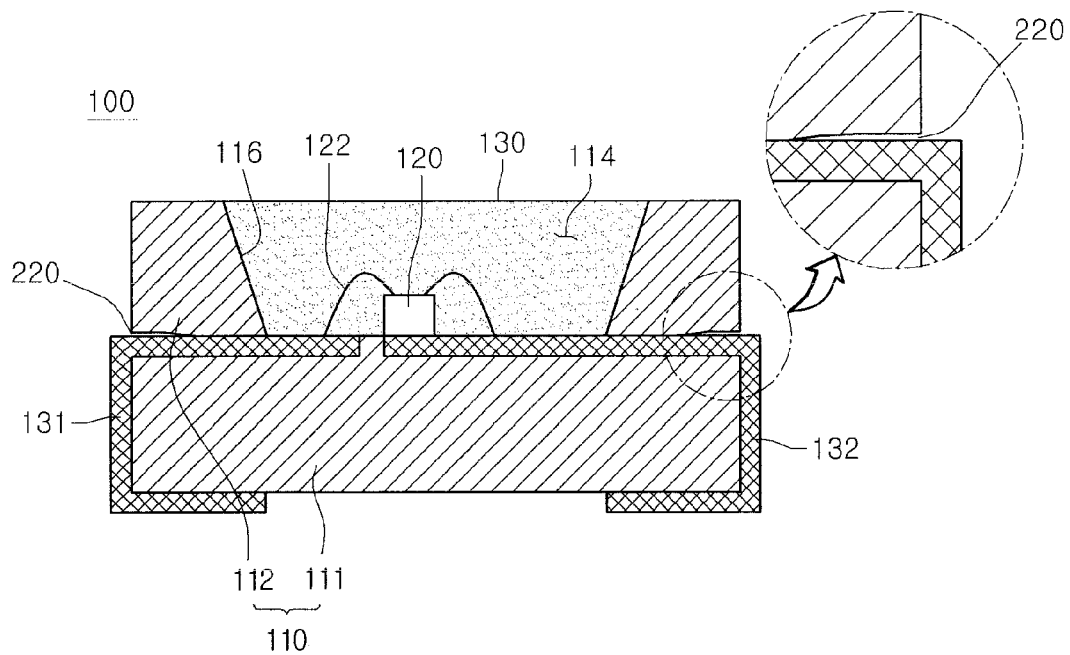

Referring to FIG. 4, a sealing material 130 is injected into a cavity 114 of the package body 110. The sealing material 130 may include a fluorescent material.

Thereafter, trimming and forming processes are performed on the first and second lead frames 131 and 132 so as to bring the first and second lead frames 131 and 132 into contact with the lateral sides and bottom side of the package body 110. During the trimming and forming processes, gaps 220 may be formed between the first and second lead frames 131 and 132 and the package body 110.

Figure 5:
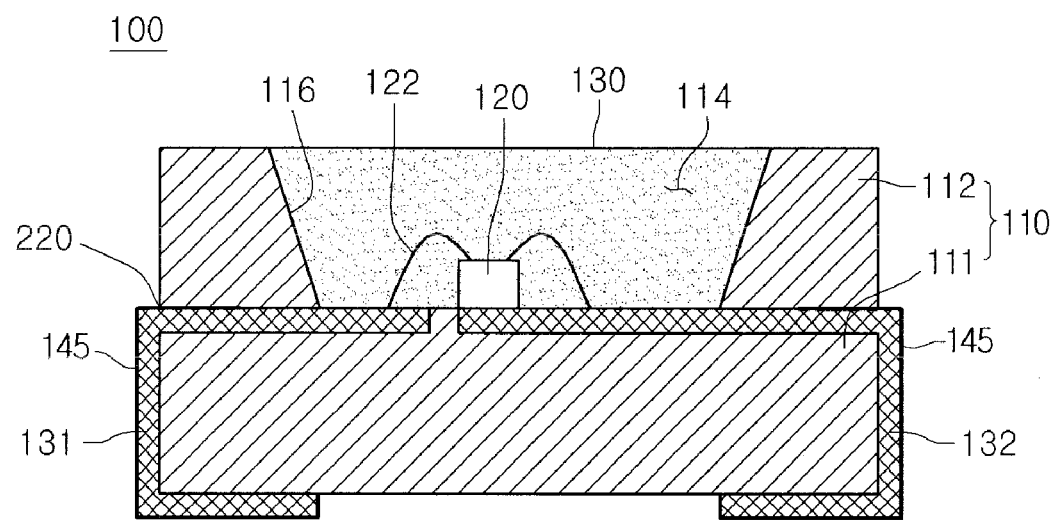

Referring to FIG. 5, a thin metal layer 145 is disposed on the first and second lead frames 131 and 132. The thin metal layer 145 may be formed by, for example, a plating process, using, for example, tin (Sn).

The thin metal layer 145 may be formed on parts of the first and second lead frames 131 and 132 that are exposed to the outside, but not on parts of the first and second lead frames 131 and 132 that are exposed to the cavity 114 or parts of the first and second lead frames 131 and 132 that make contact with the package body 110.

The thin metal layer 145 may fill the gaps 220 formed between the first and second lead frames 131 and 132 and the package body 110.

Figure 6:
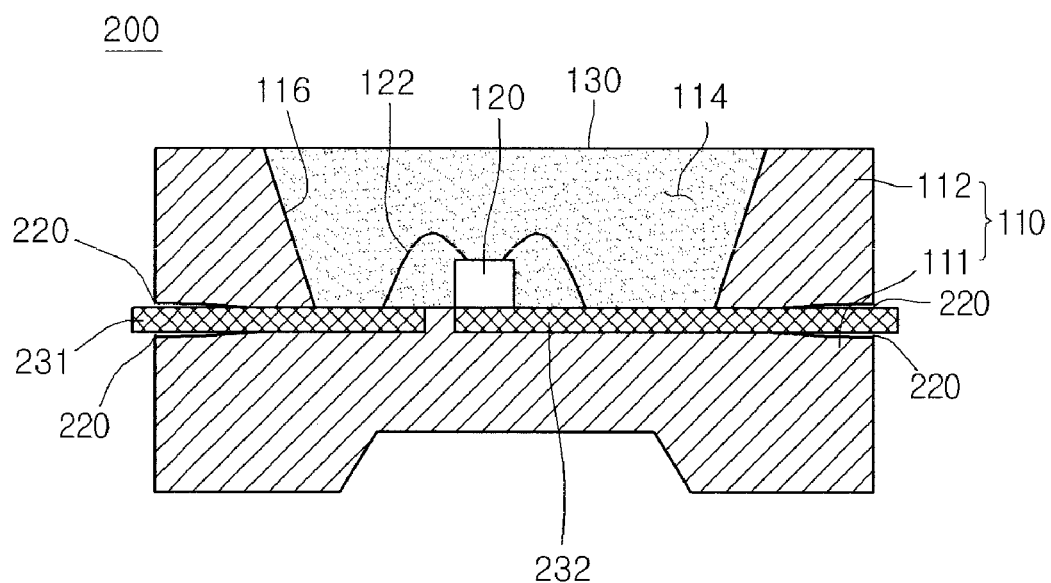
FIGS. 6 and 7 are sectional views of a light emitting device package according to another embodiment as broadly described herein.
Figure 7:
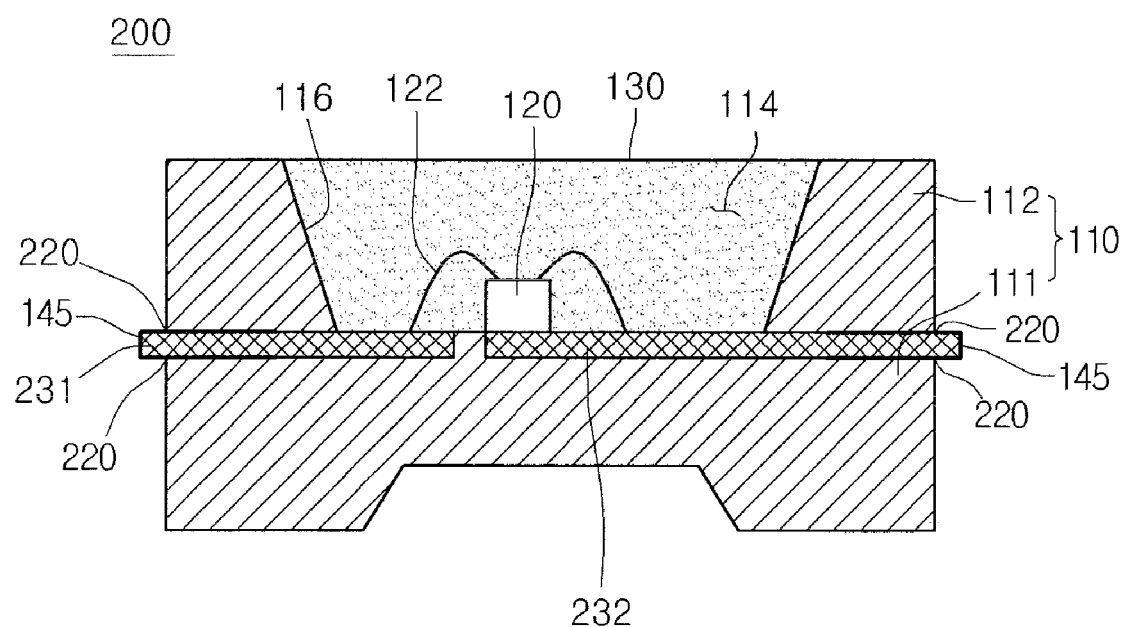

FIGS. 6 and 7 are sectional views of a light emitting device package according to another embodiment, in a light emitting device package 200 may include a package body 110 in which a cavity 114 is formed, first and second lead frames 231 and 232, a light emitting device 120, and a sealing material 130.

Portions of the first and second lead frames 231 and 232 may protrude outward from the package body 110, so that, unlike the embodiment shown in FIG. 1, the first and second lead frames 231 and 232 are not bent and do not contact the lateral sides and bottom side of the package body 110.

However, as a trimming process is performed on the first and second lead frames 231 and 232, gaps 200 may be formed between the first and second lead frames 231 and 232 and the package body 110. In this case, a thin metal layer 145 may be provided on parts of the first and second lead frames 231 and 232 that are exposed through the gaps 220.

In both of the embodiments discussed above, trimming and forming processes are performed on a plurality of lead frames. However, in alternative embodiments, one lead frame may be formed in a via-structure that penetrates the package body vertically, and trimming and forming processes may be performed on the other lead frame.

A light emitting device package having a new structure is provided.

A light emitting device package including a lead frame partially coated with a thin metal layer is provided.

A light emitting device package including a thin metal layer disposed in a gap between a lead frame and a package body is provided.

In one embodiment, a light emitting device package as broadly described herein may include a package body comprising a cavity; a lead frame penetrating the package body such that one side of the lead frame is disposed in the cavity and the other side of the lead frame is exposed to an outside of the package body, the lead frame being partially coated with a metal thin layer; and a light emitting device disposed in the cavity in electric connection with the lead frame.

In another embodiment, a light emitting device package as broadly described herein may include a package body comprising a cavity; a lead frame penetrating the package body such that one side of the lead frame is disposed in the cavity and the other side of the lead frame is exposed to an outside of the package body, the lead frame being partially coated with a metal thin layer; and a light emitting device disposed in the cavity in electric connection with the lead frame, wherein the lead frame is coated with at least one of a nickel plating layer, a gold plating layer, and a silver plating layer, and a metal thin layer is selectively disposed on the plating layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
a body comprising an upper body positioned on a lower body;
a cavity fondled in the upper body;
a lead frame comprising a first lead frame and a second lead frame that are electrically separated from each other, wherein first ends of the first and second lead frames are positioned between the upper body and the lower body and extend into the cavity, and second ends of the first and second lead frames extend out of the body and contact corresponding lateral sides and a bottom side of the lower body;
a metal layer comprising a first metal layer plated on a whole surface of the lead frame and a second metal layer plated on exposed portions of the lead frame and an interface of the upper body and the lead frame on the first metal layer; and
a light emitting device positioned in the cavity and electrically coupled to the lead frame.

2. The light emitting device package of claim 1, wherein the second metal layer is provided in gaps formed between the lead frame and the upper body.

3. The light emitting device package of claim 1, wherein the first metal layer is made of at least one of a nickel plating layer, a gold plating layer, or a silver plating layer.

4. The light emitting device package of claim 1, wherein the second metal layer is formed of tin (Sn).

5. The light emitting device package of claim 1, wherein the second metal layer makes contact with the lead frame and the upper body.

6. The light emitting device package of claim 1, wherein the second metal layer is provided in gaps formed between the upper body and the first and second lead frames.

7. The light emitting device package of claim 1, further comprising a sealing material provided in the cavity.

8. The light emitting device package of claim 7, wherein the sealing material comprises a fluorescent material.

9. A light emitting device package, comprising:
a body having a cavity formed therein;
a lead frame that penetrates the body such that a first portion of the lead frame is positioned in the cavity and a second portion of the lead frame is exposed to an outside of the body;
a metal layer comprising a first metal layer plated on a whole surface of the lead frame and a second metal layer plated on exposed portions of the lead frame and in gaps formed between the body and the lead frame; and
a light emitting device provided in the cavity and electrically coupled to the lead frame.

10. The light emitting device package of claim 9, wherein the first metal layer is made of at least one of a nickel plating layer, a gold plating layer, or a silver plating layer, and a metal layer is selectively provided on the plating layer.

11. The light emitting device package of claim 9, wherein the body comprises an upper body positioned on a lower body, and the lead frame comprises a first lead frame and a second lead frame that are electrically separated from each other, wherein first ends of the first and second lead frames are positioned between the upper body and the lower body and extend into the cavity, and second ends of the first and second lead frames extend out of the body.

12. The light emitting device package of claim 9, wherein the first metal layer is formed of tin (Sn).

13. The light emitting device package of claim 9, wherein the body comprises an upper body positioned on a lower body, and wherein the first metal layer is provided on surfaces of the lead frame that are exposed to the outside of the upper body and do not directly contact the upper body.

14. The light emitting device package of claim 9, further comprising a sealing material provided in the cavity.

15. The light emitting device package of claim 11, wherein the first metal layer is provided in gaps formed between the upper body and the first and second lead frames, and between the lower body and the first and second lead frames, and on exposed portions of the second ends of the first and second lead frames.

16. The light emitting device package of claim 14, wherein the sealing material comprises a fluorescent material.

* * * * *